United States Patent
Shako et al.

(10) Patent No.: US 7,430,250 B2
(45) Date of Patent: Sep. 30, 2008

(54) DISTORTION COMPENSATING APPARATUS

(75) Inventors: Hideharu Shako, Kawasaki (JP);
Yasuhito Funyu, Kawasaki (JP);
Takeshi Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/843,065

(22) Filed: Aug. 22, 2007

(65) Prior Publication Data

US 2007/0296495 A1    Dec. 27, 2007

Related U.S. Application Data (63) Continuation of application No. PCT/JP2005/004129, filed on Mar. 9, 2005.

(51) Int. Cl.
*H04L 25/49* (2006.01)

(52) U.S. Cl. .................................................... 375/296

(58) Field of Classification Search ......... 375/295–297, 375/285; 332/123–125, 159–160
See application file for complete search history.

(56) References Cited

U.S. PATENT DOCUMENTS

| | | | | |
|---|---|---|---|---|
| 5,404,378 | A * | 4/1995 | Kimura | ....................... 375/296 |
| 5,903,823 | A * | 5/1999 | Moriyama et al. | ........... 455/126 |
| 5,949,283 | A * | 9/1999 | Proctor et al. | ................ 330/149 |
| 6,141,390 | A * | 10/2000 | Cova | ............................ 375/297 |
| 6,757,525 | B1 * | 6/2004 | Ishikawa et al. | ......... 455/114.3 |
| 6,836,517 | B2 | 12/2004 | Nagatani et al. | |
| 7,012,969 | B2 * | 3/2006 | Ode et al. | .................... 375/296 |
| 2002/0065048 | A1 | 5/2002 | Nagatani et al. | |
| 2005/0047521 | A1* | 3/2005 | Ishikawa et al. | ............. 375/296 |

FOREIGN PATENT DOCUMENTS

| | | |
|---|---|---|
| JP | 2001-189685 | 7/2001 |
| JP | 2003-347944 | 12/2003 |
| WO | WO 01/008320 A1 | 2/2001 |
| WO | WO 03/103163 | 12/2003 |

OTHER PUBLICATIONS

International Search Report mailed Jun. 28, 2005, from the corresponding International Application.

* cited by examiner

*Primary Examiner*—Tesfaldet Bocure
(74) *Attorney, Agent, or Firm*—Katten Muchin Rosenman LLP

(57) ABSTRACT

The number of times of referring to of a storing unit in a distortion compensating apparatus is averaged and temporary degradation of the distortion property is avoided. The distortion compensating apparatus include a pre-distorting unit that applies a distortion compensating process to a transmission signal using a distortion compensation coefficient, a distortion compensation calculating unit that calculates a distortion compensation coefficient based on the transmission signal before the distortion compensation and a feedback fed back from an output of a distortion device, an address generating circuit that produces an address corresponding to the transmission signal, and a storing unit that updates the calculated distortion compensation coefficient to the produced address and that stores the produced address. The address generating circuit produces an address corresponding to the transmission signal by multiplying the power of the transmission signal by a predetermined coefficient and varies the predetermined coefficient.

5 Claims, 10 Drawing Sheets

FIG.7A $P_1 = G \times P + N$ $\Delta P_1 = G_1 \times (P_{1n} - P_{1n-1}) + N_2$

FIG.10A $P_1 = G_1 \times P_n + N_1$ $\Delta P = G_2 \times (P_n - P_{n-1}) + N_2$

FIG.10B

NUMBER OF TIMES OF REFERRING TO

ADDRESS POSITION

DISTORTION COMPENSATING APPARATUS

TECHNICAL FIELD

The present invention relates to a pre-distortion compensating apparatus that applies in advance a distortion compensating process to a signal to be transmitted before amplifying the signal.

BACKGROUND ART

Recently, highly efficient transmission by digitalization has been often employed in wireless communication. When a multi-phase modulation scheme is applied to the wireless communication, a technique is important according to which power leak from adjacent channels is reduced by suppressing a non-linear distortion by linearizing the amplification property especially of a transmission power amplifier on the transmitting side.

When the improvement of the power efficiency is promoted by using an amplifier having low linearity, a technique of compensating the non-linear distortion caused by the low linearity is indispensable.

Figure 1:
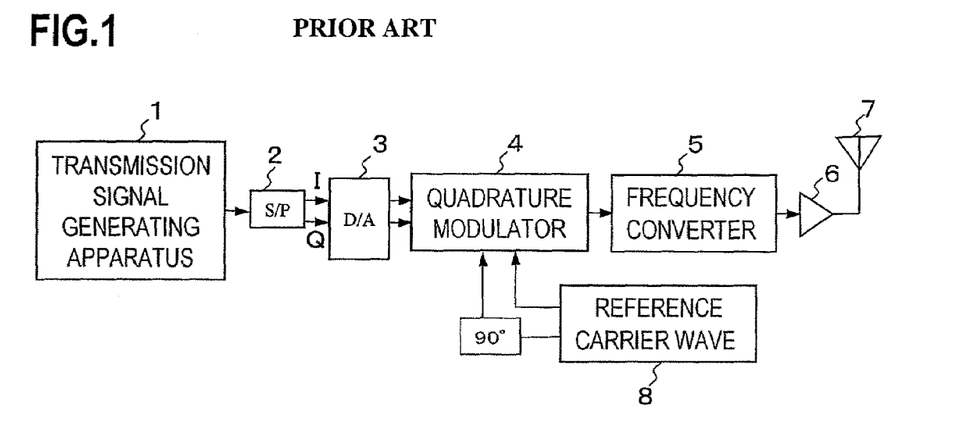
FIG. 1 is a block diagram of an example of a transmitting apparatus in a conventional wireless communication apparatus.

FIG. 1 is a block diagram of an example of a transmitting apparatus in a conventional wireless communication apparatus. A transmission signal generating apparatus 1 sends a serial digital data train. A serial/parallel converter (S/P converter) 2 sorts the digital data train alternately one bit by one bit and converts the sorted bits into two types signals that are an in-phase component signal (I signal: In-Phase component) and a quadrature component signal (Q signal: Quadrature component).

A D/A converter 3 converts each of the I signal and the Q signal into analog base band signals and inputs the converted signals into a quadrature modulator 4. The quadrature modulator 4 multiplies the inputted I signal and the inputted Q signal (transmission base-ban$ signals) respectively by a reference carrier wave 8 and a carrier wave obtained by shifting the phase of the reference carrier wave 8 by 90°, executes quadrature conversion by adding the multiplication result, and outputs the conversion result.

A frequency converter 5 mixes a quadrature modulation signal and a local oscillation signal and converts the frequency thereof into a radio frequency. A transmission power amplifier 6 amplifies the power of a radio frequency signal outputted from the frequency converter 5 and radiates the amplified signal into the air from a aerial wire (antenna) 7.

Figure 2:
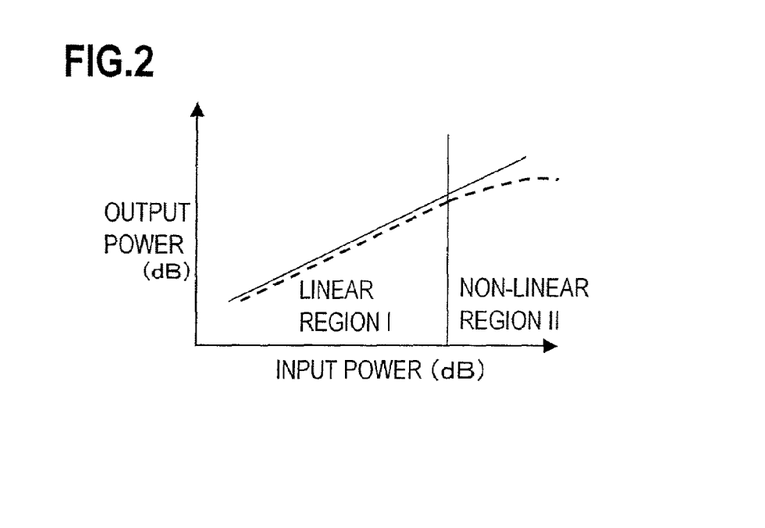
FIG. 2 is a chart of input/output property (having a distortion function f(p)) of a transmission power amplifier.

In this case, in mobile communication such as W-CDMA, the transmission power of a transmitting apparatus is large such as 10 mW to several 10 mW and input/output property (having a distortion function f(p)) of the transmission power amplifier 5 is non-linear as indicated by a dotted line of FIG. 2. Because of this non-linear property, a non-linear distortion is generated and a frequency spectrum around a transmission frequency of has a side lobe indicated by a solid line b that is raised from the property "a" of the dotted line of FIG. 3. Therefore, leaking is generated into adjacent channels and adjacent interference is generated. That is, due to the non-linear distortion shown in FIG. 2, the power that is the transmission wave leaking to an adjacent frequency channel becomes large as shown in FIG. 3.

Figure 3:
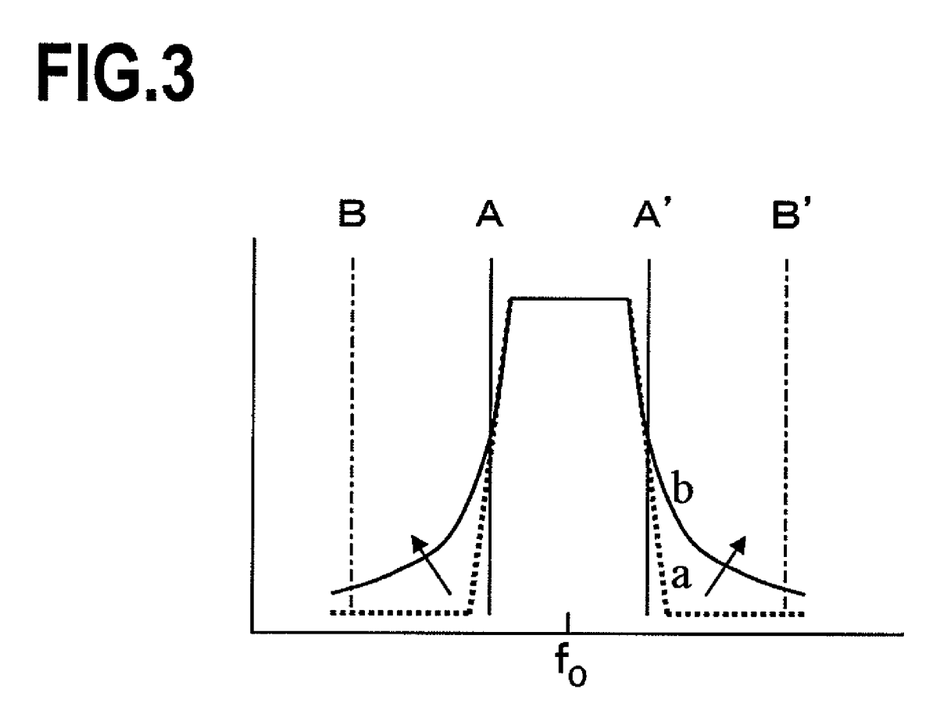
FIG. 3 is a diagram for explaining non-linear distortion generated due to a non-linear property.

ACPR (Adjacent Channel Power Ratio) that represents the magnitude of leaking power is a ratio of the power of the channel of interest that is the area of a spectrum between lines A and A' of FIG. 3 and adjacent leaking power that is the area of a spectrum that leaks to an adjacent channel between lines B and B'. Such leaking power is a noise to other channels, degrades the communication quality of those channels, and, therefore, is strictly regulated.

The leaking power is, for example, small in a linear region (see a linear region I of FIG. 2) and large in a non-linear region II of a power amplifier. To make an amplifier a high-power transmission power amplifier, the linear region I needs to be wide. However, for this, an amplifier that has a capacity exceeding a capacity actually needed is necessary. A problem has arisen that such an amplifier is disadvantageous in terms of cost and the size of the apparatus. Therefore, a distortion compensating function that compensates the distortion of the transmission power is provided for a wireless apparatus.

Figure 4:
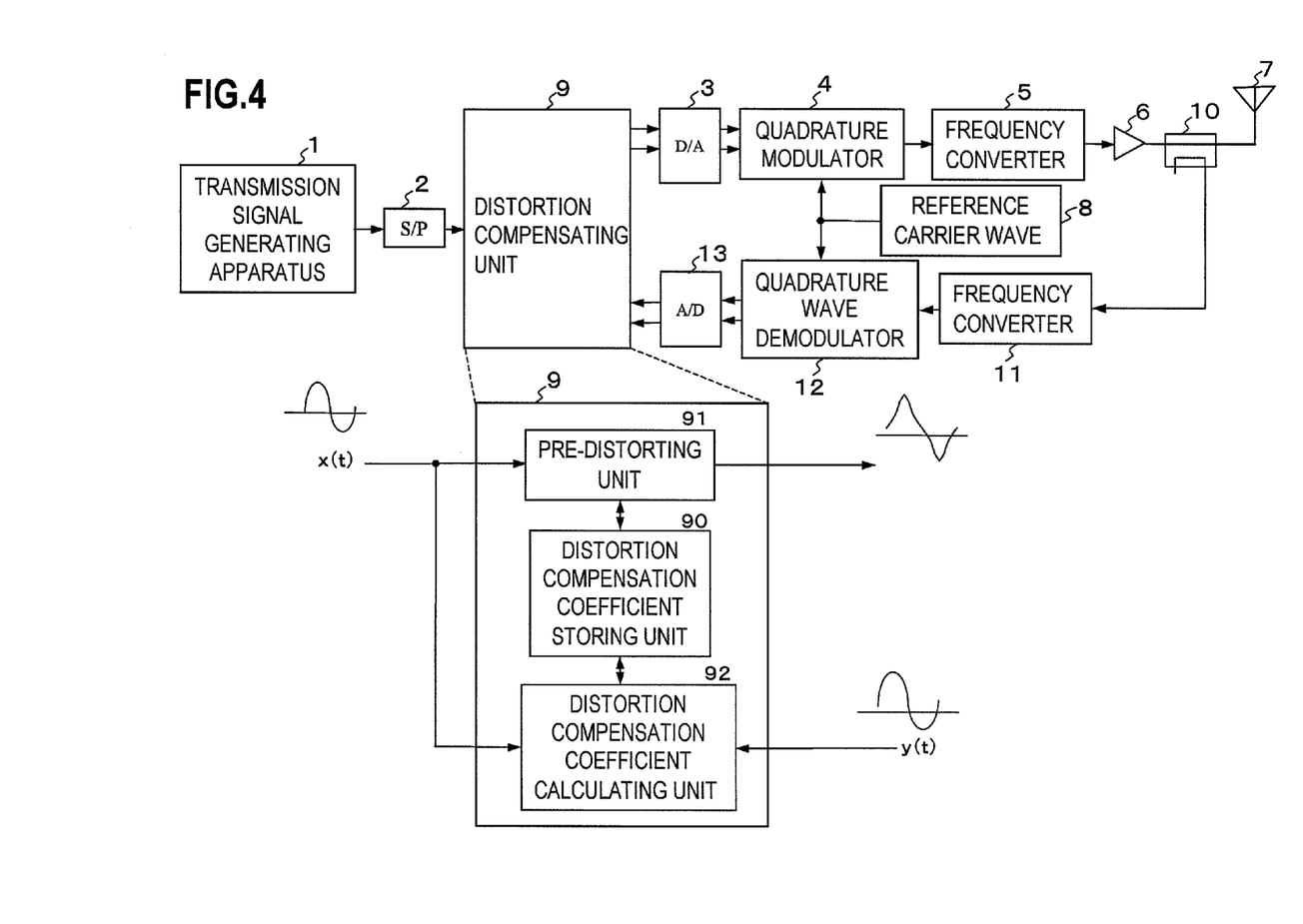
FIG. 4 is a block diagram of a transmitting apparatus including a digital non-linear distortion compensating function using a DSP (Digital Signal Processor).

FIG. 4 is a block diagram of a transmitting apparatus including a digital non-linear distortion compensating function. A digital data cluster (transmission signal) sent from the transmission signal generating apparatus 1 is converted into the two types of I signal and Q signal in the S/P converter 2 and, as a preferred example, the signals are inputted into a distortion compensating unit 9 constituted of a DSP (Digital Signal Processor).

As shown being enlarged in the lower portion of FIG. 4, the distortion compensating unit 9 includes a distortion compensation coefficient storing unit 90 that stores a distortion compensation coefficient h(pi) corresponding to the power pi (i=0 to 1023) of a transmission signal x(t), a pre-distorting unit 91 that applies a distortion compensating process (pre-distorting) to the transmission signal using the distortion compensation coefficient h(pi) corresponding to the power level of the transmission signal, and a distortion compensation coefficient calculating unit 92 that compares the transmission signal x(t) with a demodulated signal (feedback signal) y(t) demodulated by a quadrature wave demodulator described later, that calculates the distortion compensation coefficient h(pi) such that the difference obtained by the comparison is zero, and that updates the distortion compensation coefficient of the distortion compensation coefficient storing unit 90.

The signal applied with the distorting process by the distortion compensating unit 9 is inputted into the D/A converter 3. The D/A converter 3 converts the inputted I signal and the inputted Q signal into analog base band signals and inputs the base band signals into the quadrature modulator 4. The quadrature modulator 4 multiplies the inputted I signal and the inputted Q signal respectively by the reference carrier wave 8 and a carrier wave obtained by shifting the phase of the reference carrier wave 8 by 90°, executes quadrature modulation by adding the multiplication results, and outputs the modulation result.

The frequency converter 5 mixes a quadrature modulation signal and a local oscillation signal and converts the frequency thereof. The transmission power amplifier 6 amplifies the power of a radio frequency signal outputted from the frequency converter 5 and radiates the amplified signal into the air from a aerial wire (antenna) 7.

A portion of the transmission signal is inputted into a frequency converter 11 through a directional coupler 10. The frequency converter 11 converts the frequency of the portion and the portion is inputted into a quadrature wave demodulator 12. The quadrature wave demodulator 12 multiplies the transmission signal respectively by the reference carrier wave and a signal obtained by shifting the phase of the reference carrier wave by 90°, thereby, executes quadrature modulation, restores the I signal and the Q signal of the base band on the transmission side, and input these signals into an A/D converter 13.

The A/D converter 13 converts the inputted I and Q signals into digital signals and inputs the digital signals into the distortion compensating unit 9. The distortion compensation coefficient calculating unit 92 of the distortion compensating unit 9: compares the transmission signal before the distortion compensation with the feedback signal demodulated by the quadrature wave demodulator 12, by an adaptive signal process using an LMS (Least Mean Square) algorism; calculates the distortion compensation coefficient h(pl) such that the difference obtained in the comparison is zero; and, thereby, updates the coefficient stored in the distortion compensation coefficient storing unit 90. Thereafter, by repeating the above operations, the non-linear distortion of the transmission power amplifier 6 is suppressed and, thereby, the leaking power to the adjacent channels is reduced.

Figure 5:
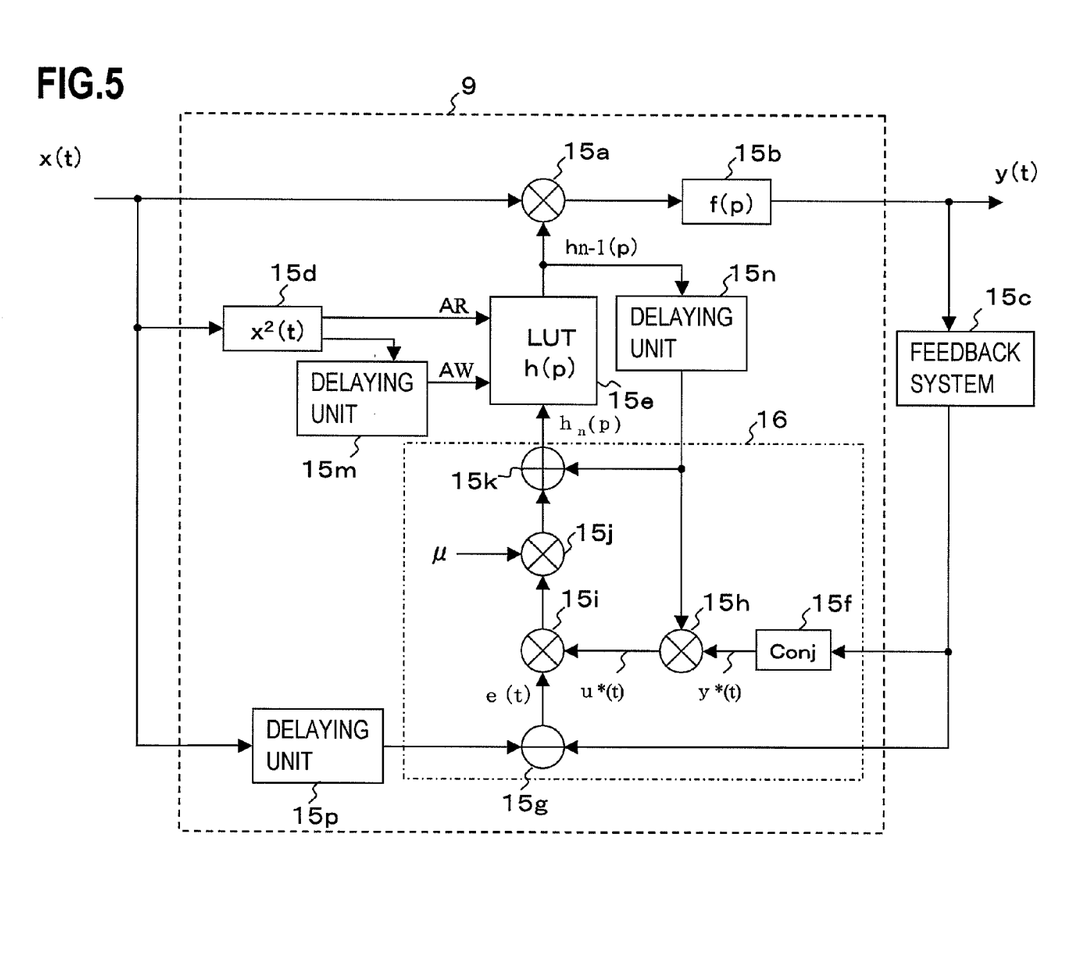
FIG. 5 is a diagram for explaining the case where a distortion compensating process by the adaptive LMS is executed in a distortion compensating unit 9 in FIG. 4.

An exemplary configuration used when distortion compensating process by the adaptive LMS as shown in FIG. 5 is executed is described in, for example, Patent Document 1 as an example configuration of the distortion compensating unit 9 in FIG. 4.

In FIG. 5, the pre-distorting unit 91 of FIG. 4 corresponds to a multiplier 15a and multiplies the transmission signal x(t) by a distortion compensation coefficient $h_{n-1}(p)$. The transmission power amplifier 6 is corresponded by a distortion device 15b including the distortion function f(p).

A portion including the frequency converter 11, the quadrature wave demodulator 12, and the A/D converter 13, that feeds back an output signal from a transmission power amplifier 15b in FIG. 4 is shown as a feedback system 15c in FIG. 5.

In FIG. 5, the distortion compensation coefficient storing unit 90 in FIG. 4 is constituted of a look up table (LUT) 15e. The distortion compensation coefficient calculating unit 92 of FIG. 4 that produces an update value for the distortion compensation coefficient stored in the look up table 15e is constituted of a distortion compensation coefficient calculating unit 16.

In the distortion compensating apparatus having the configuration shown in FIG. 5, the look up table 15e stores a distortion compensation coefficient for canceling the distortion of the transmission power amplifier 6 that is the distortion device 15b corresponding to each piece of power, that is discrete, of the transmission signal x(t).

When inputted with the transmission signal x(t), an address generating circuit 15d calculates the power $p(=x^2(t))$ of the transmission signal x(t), produces an address that uniquely corresponds to the calculated power $p(=x^2(t))$ of the transmission signal x(t), and outputs the address as designating information of a reading address.

A distortion compensation coefficient $h_{n-1}(p)$ stored in this reading address is read from the look up table 15e and is used for the distortion compensating process in 15a.

The update value for updating of the distortion compensation coefficient stored in the look up table 15e is calculated by the distortion compensation coefficient calculating unit 16.

That is, the distortion compensation coefficient calculating unit 16 is configured including a conjugate complex signal output unit 15f and multipliers 15h to 15j. A subtracter 15g outputs the difference e(t) between the transmission signal x(t) and the feedback demodulated signal y(t). The multiplier 15h multiplies the distortion compensation coefficient $h_{n-1}(p)$ and y*(t) and obtains an output u*(t) ($h_{n-1}(p)y*(t)$). The multiplier 15i multiplies the difference output e (t) of the subtracter 15g and u*(t). The multiplier 15j multiplies a step size parameter μ and the output of the multiplier 15i.

An adder 15k adds the distortion compensation coefficient $h_{n-1}(p)$ and the output μe(t)u*(t) of the multiplier 15j and obtains the update value of the look up table 15e.

This update value is stored at a writing address (AW) that the address generating circuit 15d designates as the address that uniquely corresponds to the power $p(=x^2(t))$ of the transmission signal.

Though the reading address and the writing address are the same address, the reading address is delayed by a delaying unit 15m and is used as a writing address because the time for the calculation, etc., is necessary until the update value is obtained.

Delaying units 15m, 15n, and 15p add to the transmission signal x(t) a delay time D that is from the time when the transmission signal is inputted to the time when the feedback demodulated signal y(t) is inputted into the subtracter 15g. The delay time D set in the delaying units 15m, 15n, and 15p is determined such that, for example, D=D0+D1 is satisfied where a delay time in the transmission power amplifier 15b is D0 and a delay time of the feedback system 15c is D1.

The above configuration executes the calculation expressed below.

$h_n(p)=h_{n-1}(p)+\mu e(t)u*(t)$ $e(t)=x(t)-y(t)$ $y(t)=h_{n-1}(p)x(t)f(p)$ $u*(t)=x(t)f(p)=h_{n-1}(p)$ $y*(t)$ $p=|x(t)|^2$ where x, y, f, h, u, and e are complex numbers and "*" indicates a conjugate complex number.

By executing the above calculation process, the distortion compensation coefficient h(p) is updated such that a difference signal e(t) between the transmission signal x(t) and the feedback demodulated signal y(t) becomes the minimum, the coefficient h(p) is finally converged to the optimal distortion compensation coefficient value, and the distortion of the transmission power amplifier 6 is compensated. Patent Document: PCT International Publication No. WO2003/103163

DISCLOSURE OF THE INVENTION

Problems that the Invention is to Solve

Figure 6A:
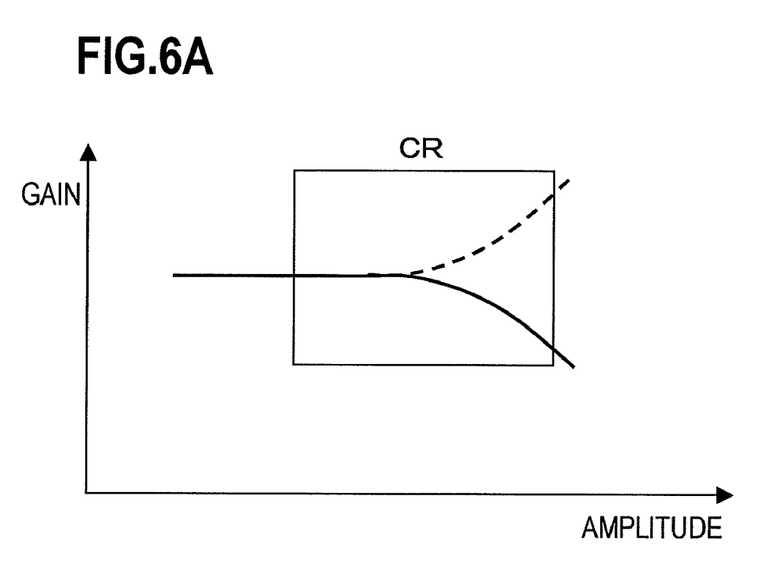
FIG. 6A is a chart of the gain property to the amplitude of a transmission power amplifier 6.
Figure 6B:
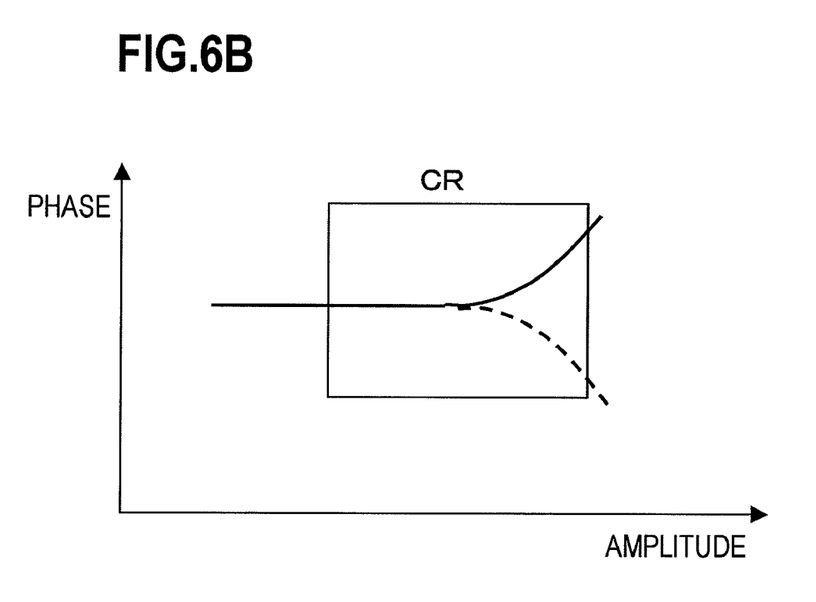
FIG. 6B is a chart of the phase property to the amplitude of the transmission power amplifier 6.

The property of the transmission power amplifier 6 that is the distortion device, and the distortion compensation coefficient stored in the look up table 15e will be discussed. FIG. 6A is a chart of the gain property to the amplitude of the transmission power amplifier 6. FIG. 6B is a chart of the phase property to the amplitude of the transmission power amplifier 6.

For both of the gain property to the amplitude and the phase property to the amplitude, the amplifier 6 has the distortion property that the gain becomes small and the phase rotation amount becomes large when the amplitude becomes large. Therefore, it is necessary to provide a distortion compensation coefficient value with the sign to cancel the gain reduction and the phase rotation amount corresponding to the amplitude of the transmission signal, that is, the transmission signal power.

Therefore, the look up table stores a distortion compensation coefficient in an address uniquely corresponding to the level of the transmission signal and outputs the distortion compensation coefficient from the address that uniquely corresponds to the level of the transmission signal. The distortion compensation coefficient is sophisticated by sufficiently executing the above updating process, and becomes the optimal distortion compensation coefficient.

However, the level of the transmission signal does not vary evenly but is biased. Therefore, a distortion compensation coefficient is present that has a low probability to be updated. When the frequency of being updated is low as above, the degree of confidence as a distortion compensation coefficient is also low. In the case where the coefficient is updated to a value away from the optimal value by discretely updating, when the coefficient is suddenly applied as the distortion compensation coefficient frequently due to the variation of the transmission frequency, etc., the distortion compensating process may take time to stabilize or the value of the coefficient is diverged by the updating process.

Therefore, the object of the present invention is to avoid occurrence of the adverse effect to the distortion compensating process due to a distortion compensation coefficient with low frequency of updating.

Means for Solving the Problems

A distortion compensating apparatus of a first aspect to achieve the above object of the present invention comprises a storing unit that stores a distortion compensation coefficient at a designated writing address and that outputs the distortion compensation coefficient stored in a designated reading address; a pre-distorting unit that applies a distortion compensating process to a transmission signal using the distortion compensation coefficient outputted from the storing unit; a distortion compensation calculating unit that calculates a distortion compensation coefficient based on the transmission signal before the distortion compensating process and the transmission signal after amplification by an amplifier; and an address generating unit that designates a writing address corresponding to the level of the transmission signal before the distortion compensating process, wherein the address generating unit can designate a different writing address even for the same level.

In the distortion compensating apparatus of the first aspect, as a second aspect to achieve the above object of the present invention, the address generating unit designates a different writing address even for the same level by multiplying the power of the transmission signal by a different coefficient or adding a different offset value to the power of the transmission signal.

In the distortion compensating apparatus of the first aspect, as a third aspect to achieve the above object of the present invention, the coefficient or the offset value is regularly changed. In the distortion compensating apparatus, as a fourth aspect to achieve the above object of the present invention, the address generating unit designates at least a two-dimensional address as the writing address; an address corresponding to the power of the current transmission signal is designated as a first-dimension address; and an address corresponding to the variation amount between the power of the current transmission signal and the power of the previous transmission signal is designated as a second-dimension address.

In the distortion compensating apparatus, as a fifth aspect to achieve the above object of the present invention, representing the power of the transmission signal before the distortion compensating process as "p", the address generating unit obtains the first-dimension address from $P(t)=G1 \times \log(p)+N1$, the unit obtains the second-dimension address from $\Delta p = G2 \times \{P(t)-P(t-1)\}+N2$, and the unit designates a different writing address by varying the value of at least any of coefficients G1 and G2 and offset values N1 and N2 even when the level of the transmission signal before the distortion compensating process is the same level.

Effect of the Invention

According to the present invention, even when the level of the transmission signal is same, the writing address to store the distortion compensation coefficient can be varied and, therefore, occurrence can be avoided of the adverse effect to the distortion compensating process due to a distortion compensation coefficient with low frequency of updating.

Effective use of the storing unit, and avoidance of temporary degradation of the distortion property when the inputted data is varied are enabled.

DESCRIPTION OF REFERENCE NUMERALS 1 transmission signal generating apparatus
2 serial/parallel converting circuit
9 distortion compensating unit
3, 52 D/A converter
4 quadrature modulator
5 frequency converter
6 transmission power amplifier
13 A/D converter
7 antenna
6 distortion compensation coefficient producing circuit
30 controlling block 31 bus
32 CPU
33 non-volatile memory

BEST MODES FOR CARRYING OUT THE INVENTION

Description will be given for exemplary embodiments of the present invention referring to the drawings. The exemplary embodiments are only for understanding of the present invention and the technical scope of the present invention is not limited to the embodiments.

Figure 8:
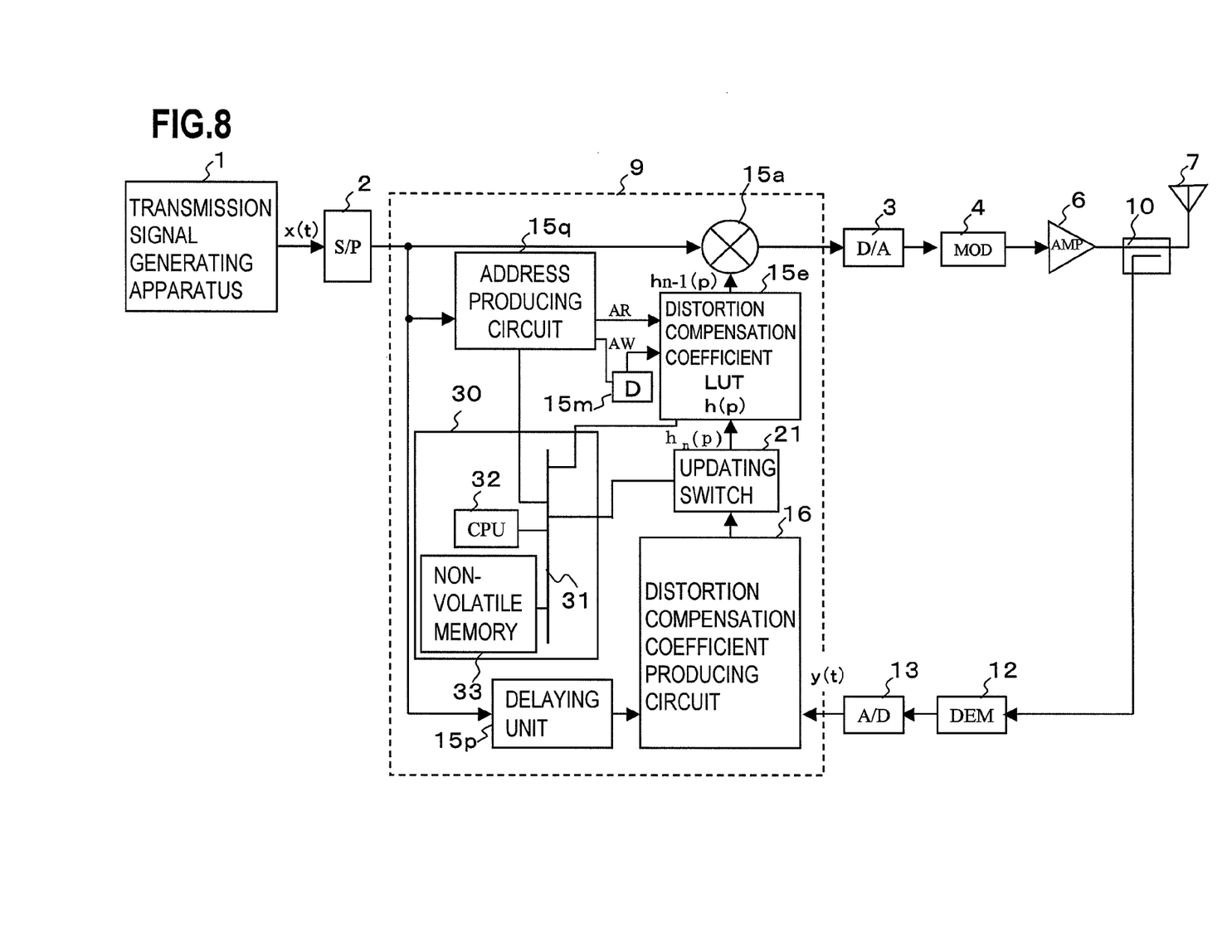
FIG. 8 is a block diagram of a transmitting apparatus including an example configuration of a distortion compensating apparatus including a digital non-linear distortion compensating function according to the present invention.

FIG. 8 is a block diagram of a transmitting apparatus including an example configuration of a distortion compensating apparatus including a digital non-linear distortion compensating function according to the present invention.

Components having the same functions as those of FIGS. 4 and 5 are given the same reference numerals.

In FIG. 8, a distortion compensating apparatus 9 includes a controlling block 30. The controlling block 30 includes a CPU 32 and a non-volatile memory 33 that are connected to a bus 31. The distortion compensating apparatus 9 has an address generating circuit 15$q$.

A distortion compensation coefficient producing circuit 16 operates similarly to the circuit in FIG. 5. However, the exemplary embodiment shown in FIG. 8 has a updating switch 21 between the distortion compensation coefficient producing circuit 16 and a look up table 15$e$ that stores a distortion compensation coefficient.

Figure 9A:
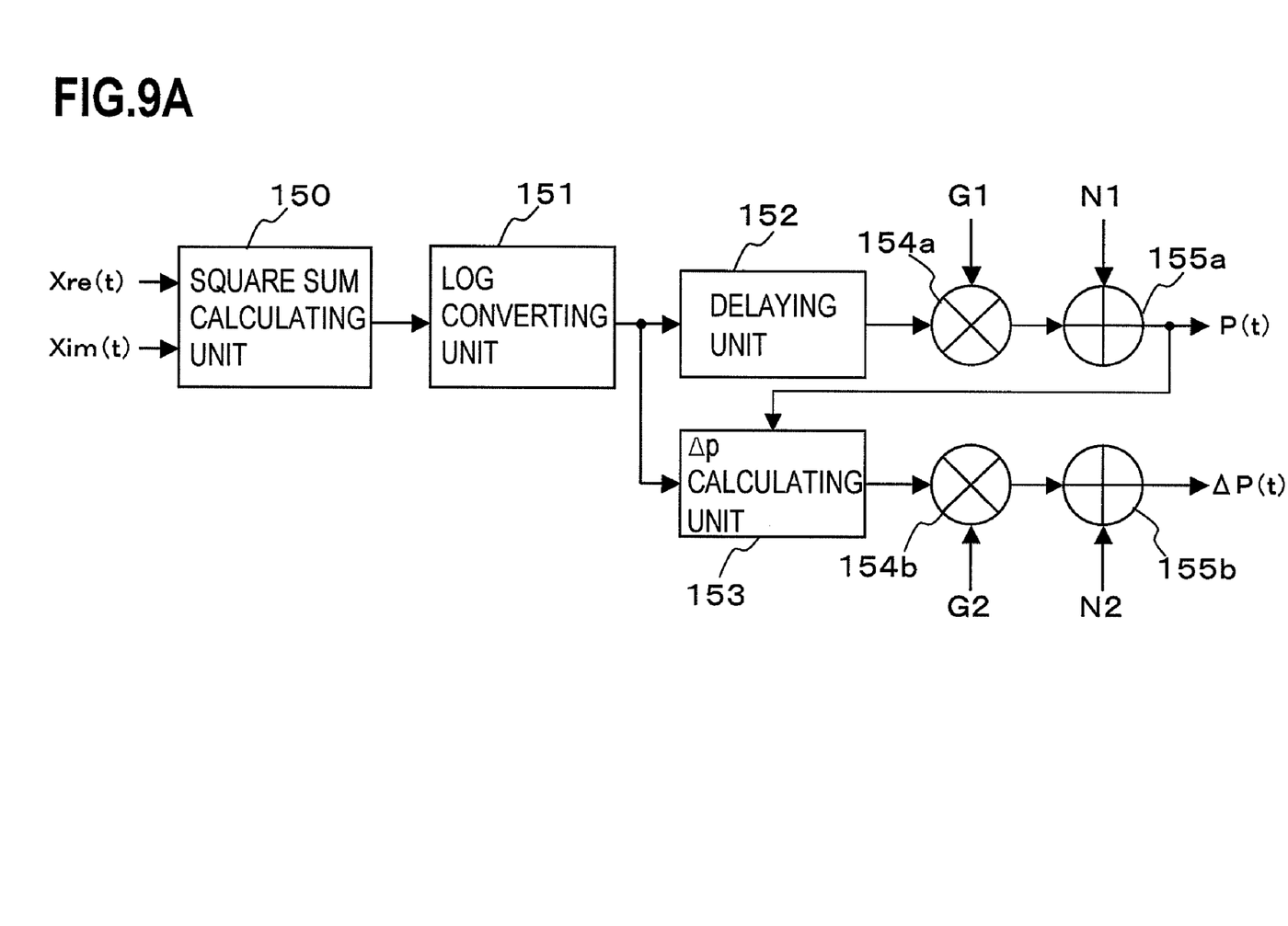
FIG. 9A is a diagram of a first example of an address generating circuit 15q.

A circuit shown in FIG. 9A can be used as an example of the address generating circuit 15$q$.

Description will be given for an example of the address generating circuit referring to FIG. 9A.

Though the address generating circuit designates a two-dimensional address in the example below, the address may be one-dimensional. In this case, for example, P(t) described later may be used as the one-dimensional address.

A transmission signal X(t) inputted from the transmission signal generating apparatus 1 is a complex signal and, expressing a real part as Xre(t) and an imaginary part as Xim(t), the address generating circuit 15$q$ calculates a squared value in a square sum calculating unit 150 thereof, obtains the sum thereof p($=$Xre(t)$^2$+Xim(t)$^2$), and outputs the sum.

"p" is converted into a logarithm value ($=$log(p)) by a LOG converting unit 151. The logarithm value ($=$log (p)) is inputted into a delaying unit 152 and a $\Delta$p calculating unit 153. The delaying unit 152 outputs the logarithm value ($=$log(p)) delaying the value for the time necessary for processing in the $\Delta$p calculating unit 153.

The $\Delta$p calculating unit 153 calculates the difference {P(t)$-$P(t$-$1)} between the power P(t) of the current transmission signal and the previous power P(t$-$1).

Therefore, the output log(p) from the delaying unit 152 and the output {P(t)$-$P(t$-$1)} from the $\Delta$p calculating unit 153 are obtained being synchronized with each other.

To the output from the delaying unit 152 and the output from the $\Delta$p calculating unit 153, a multiplying circuits 154$a$ and 154$b$ multiply respectively by multiplication coefficients G1 and G2 and adders 155$a$ and 155$b$ add respectively offset values N1 and N2.

An output P(t)($=$G1$\times$log(p)+N1) from the adder 155$a$ is provided as an address in the X axis direction (an address of a first dimension) of the look up table 15$e$.

An output $\Delta$p($=$G2$\times$(Pt$-$Pt$-$1)+N2P(t)) from the adder 155$b$ is provided as an address in the Y axis direction (an address of a second dimension) of the look up table 15$e$.

Therefore, when the transmission signal x(t) is inputted, a combination of P(t)($=$G1$\times$log(p)+N1) and $\Delta$p($=$G2$\times$(Pt$-$Pt$-$1)+N2P(t)) is outputted from the address generating circuit 15$q$ as a reading address (AR). The distortion compensation coefficient stored at the reading address is read. Thereby, the distortion compensating process in 15$a$ is executed.

At the writing address obtained by delaying the reading address by 15$m$, the look up table 15$e$ stores an updated value of the distortion compensation coefficient outputted from the distortion compensation coefficient producing circuit corresponding to the difference between the transmission signal x(t) and the fed-back transmission signal.

However, in the embodiment, even when the power of the transmission signal before the distortion compensating process is applied to is the same power, the address can be outputted as a different address by varying one or more of the multiplication coefficients G1 and G2 and the offset values N1 and N2.

"First Example of Address Control"

That is, the CPU 32 produces a different reading (writing) address by executing control to vary one or more of the multiplication coefficients G1 and G2 and the offset values N1 and N2 at a predetermined cycle even when the transmission signal is at the same level.

In this example, because the writing address is produced by simply delaying the reading address, the variation of the multiplication coefficients and the offset values is the same variation for both of the reading address and the writing address.

For example, by controlling the CPU to switch the value of N to be +1, 0, and −1 in this order for each address production, the writing address of the update value of the distortion compensation efficient is varied.

Thereby, the address can be converted into an address with a low appearance frequency by varying adjacent addresses and occurrence of a distortion compensation coefficient with a low update frequency can be suppressed.

In this case, because the address is converted into an address with a low appearance frequency by varying adjacent addresses, the power of the transmission signal does not differ so much and, therefore, the value is close to the optimal value as the update value of the distortion compensation coefficient.

Not only for the X-axis direction but also for the Y-axis direction, because the adjacent addresses that has the amount of variation of the power of the transmission signal approximated to that of the address are varied, the value is similarly close to the optimal value as the update value of the distortion compensation coefficient.

When the multiplication coefficient G is varied, an address with a low appearance frequency can also be forcedly produced. When G is increased, the variation amount of the address to the variation of the power is increased. When G is decreased, the variation amount of the address to the variation of the power is decreased.

"Second Example of Address Control"

Figure 9B:
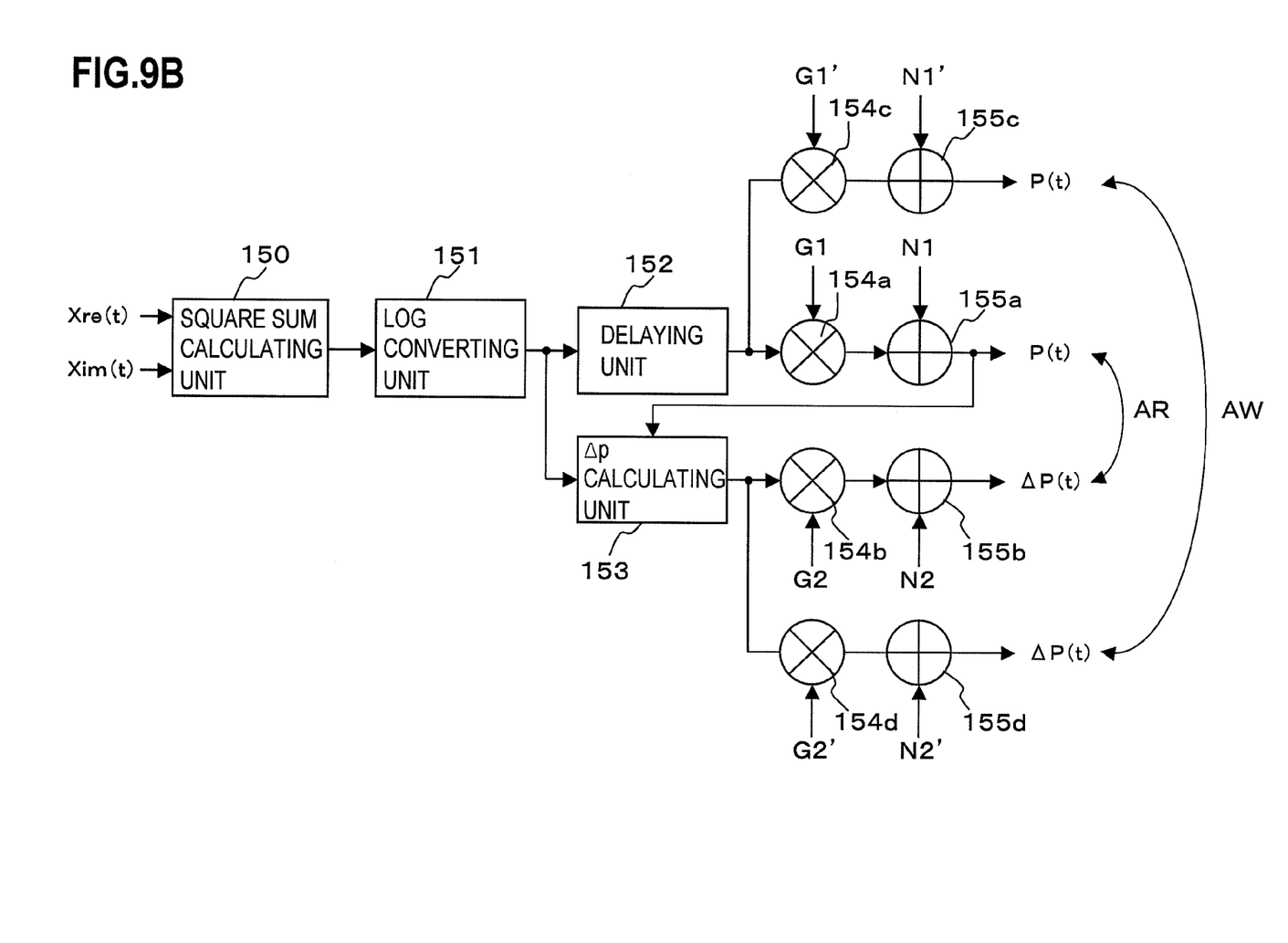
FIG. 9B is a diagram of a second example of an address generating circuit 15q.

In this example, when an address is produced, varying the multiplication coefficients G1 and G2 and the offset values N1 and N2 is not necessary as above and an address uniquely determined by the power of the transmission signal before the distortion compensating process is applied is outputted. That is, G1, G2, N1, and N2 are fixed values.

When the writing address is produced, G1', G2' as the multiplication coefficients and offset values N1' and N2' are used and are values of which one or more is(are) value(s) varied against G1, G2, N1, and N2.

FIG. 9B is a diagram of an address generating circuit 15q corresponding to a second example of the control. Simply describing the operation the circuit 15q, the CPU sets zero as N1 and N2 when the reading address is produced, and switches the values of N1' and N2' respectively among +1, 0, and −1 when the writing address is produced and, thereby, the CPU varies the writing address of the update value of the distortion compensation coefficient.

Thereby, the address can be converted into an address with a low appearance frequency by varying the adjacent addresses, and occurrence of a distortion compensation coefficient with a low update frequency can be suppressed.

In this case, because the address is converted into an address with a low appearance frequency by varying the adjacent addresses, the power of the transmission signal does not have a large difference and, therefore, the value is close to the optimal value as the update value of the distortion compensation coefficient.

On the other hand, as described referring to FIG. 5 as above for the distortion compensation coefficient producing circuit 16, based on the transmission signal (t) and the feedback output of the transmission power amplifier 6 that is the distortion device, a distortion compensation coefficient that brings the difference between those to zero is obtained.

Preferably, the updating switch 21 is provided to form an updating time period and a non-updating time period of the distortion compensation coefficient and it is desirable that, when this switch is in an ON state thereof, an update value is sent to the look up table 15e and the distortion compensation coefficient is updated and, when the switch is in an OFF state thereof, the updating is refrained from.

Therefore, during the time period of OFF of the updating time period, the CPU 32 does not execute the above operations of the first and the second examples of the address control and may produce the reading address of the distortion compensation coefficient using the multiplication coefficients and the offset values as fixed predetermined values.

As above, the address generating circuit 15q, can write a distortion compensation coefficient for updating that has been obtained by the distortion compensation coefficient producing circuit 16 into a plurality of different addresses even when the power of the transmission signal is same as that before the application of the distortion compensating process.

Figure 7A:
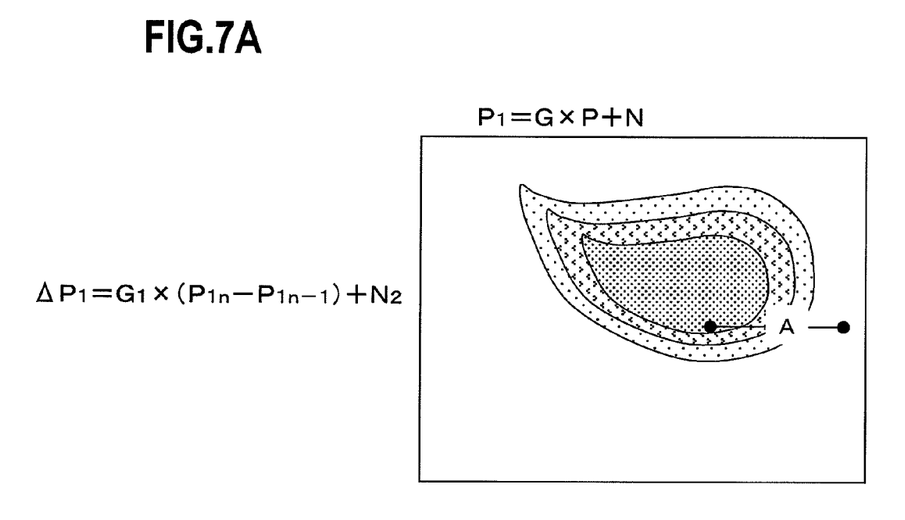
FIG. 7A is a chart of the distribution of the number of times of referring to a distortion compensation coefficient value in a look up table 15e.
Figure 7B:
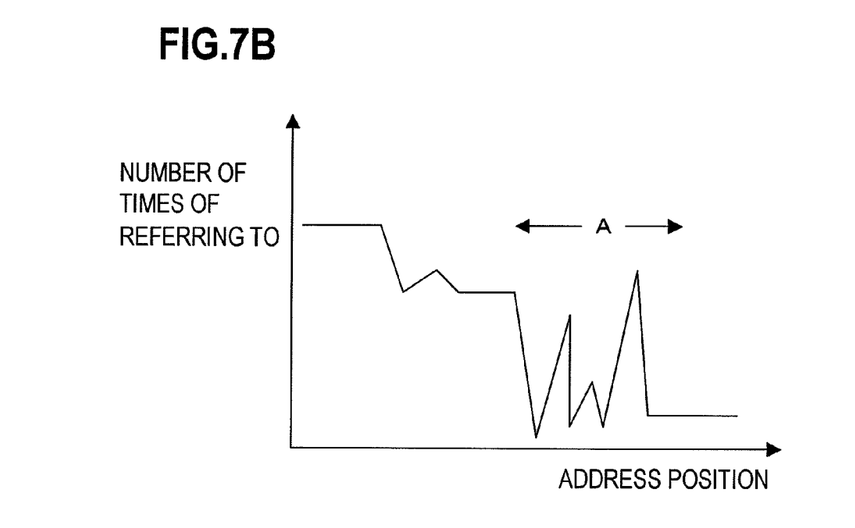
FIG. 7B is a chart of the number of times of referring in a cross section "" of FIG. 7A.

FIG. 7A is a chart of the distribution of the number of times of referring to the distortion compensation coefficient value in the look up table when the above address control according to the present invention is not executed as above. FIG. 7B is a chart of the number of times of referring in a cross section "A" of FIG. 7A.

As can be understood seeing the number of times of referring to in this cross section "A", addresses for which the distortion compensation coefficient is not updated are present in a portion with a few number of times of updating of the distortion compensation coefficient of the look up table.

In this state, the frequency of updating of the distortion compensation coefficient for each of addresses located adjacent to each other differs extremely. Thereby, when a significant change has occurred to the inputted data (for example, variation of the power or change of carrier frequency), an address point for which the distortion compensation coefficient has been hardly updated so far in the look up table may be referred to at a high probability. In this case, not only that the distortion property is temporarily degraded but also that a state occurs where the coefficient is increased and, depending on the situation, does not converge.

Figure 10A:
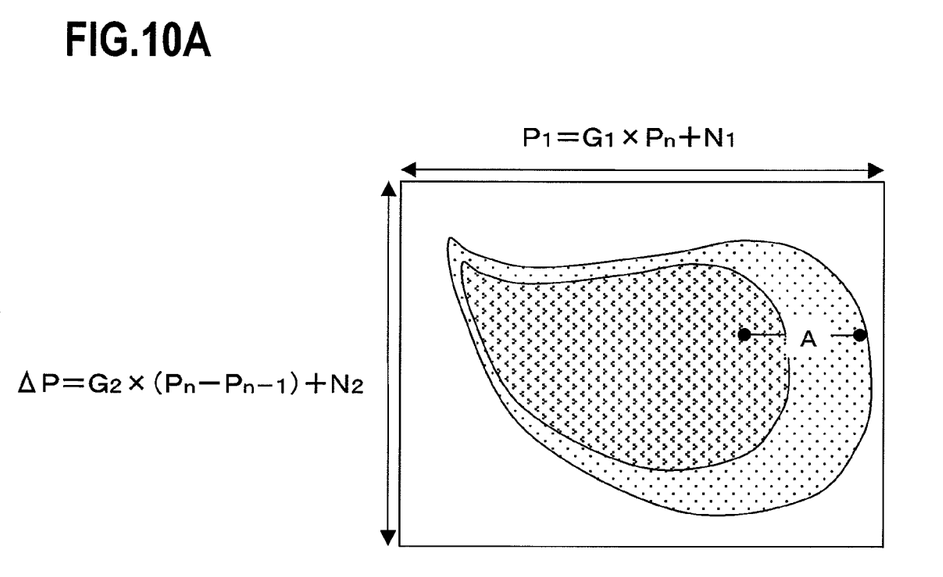
FIG. 10A is a chart of the number of times of referring (updating writing) of a look up table at each address position when the present invention corresponding to FIG. 7A is applied.
Figure 10B:
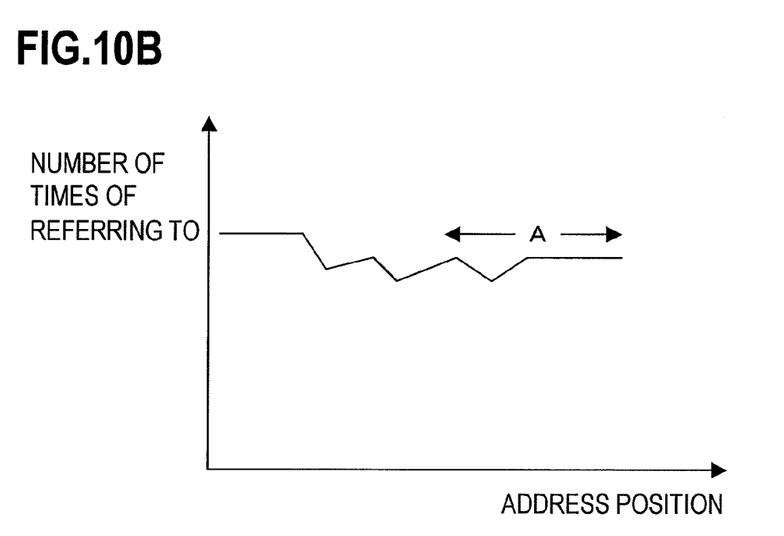
FIG. 10B is chart of averaging of the number of times of referring (updating writing) of the look up table when the present invention corresponding to FIG. 7B is applied.

On the other hand, by executing the above address control, as shown in FIGS. 10A and 10B, the number of times of referring to (updating writing) at each address position of the look up table 15e can be averaged.

INDUSTRIAL APPLICABILITY

Therefore, according to the present invention, occurrence can be avoided of adverse effects to the distortion compensating process due to a distortion compensation coefficient with low frequency of updating, and a high quality transmitter can be provided by applying the present invention to a compensating apparatus.

What is claimed is:

1. A distortion compensating apparatus comprising:
   a storing unit that stores a distortion compensation coefficient at a designated writing address and that outputs the distortion compensation coefficient stored in a designated reading address;
   a pre-distorting unit that applies a distortion compensating process to a transmission signal using the distortion compensation coefficient outputted from the storing unit;
   a distortion compensation calculating unit that calculates a distortion compensation coefficient based on the transmission signal before the distortion compensating process and the transmission signal after amplification by an amplifier; and
   an address generating unit that designates a writing address corresponding to the level of the transmission signal before the distortion compensating process, wherein
   the address generating unit can designate a different writing address even for the same level.

2. The distortion compensating apparatus according to claim 1, wherein
   the address generating unit designates a different writing address even for the same level by multiplying the power of the transmission signal by a different coefficient or adding a different offset value to the power of the transmission signal.

3. The distortion compensating apparatus according to claim 1, wherein
   the coefficient or the offset value is regularly changed.

4. The distortion compensating apparatus according to claim 1, wherein
   the address generating unit designates at least a two-dimensional address as the writing address, wherein
   an address corresponding to the power of the current transmission signal is designated as a first-dimension address, and wherein
   an address corresponding to the variation amount between the power of the current transmission signal and the power of the previous transmission signal is designated as a second-dimension address.

5. The distortion compensating apparatus according to claim 4, wherein
   representing the power of the transmission signal before the distortion compensating process as "p", the address generating unit obtains the first-dimension address from $P(t)=G1\times\log(p)+N1$, the unit obtains the second-dimension address from $\Delta p=G2\times\{P(t)-P(t-1)\}+N2$, and the unit designates a different writing address by varying the value of at least any of coefficients G1 and G2 and offset values N1 and N2 even when the level of the transmission signal before the distortion compensating process is the same level.

* * * * *